United States Patent

[11] 3,579,231

[72] Inventor Piotor Bylanski
London, England
[21] Appl. No. 760,269
[22] Filed Sept. 17, 1968
[45] Patented May 18, 1971
[73] Assignee The General Electric and English Electric Companies Limited
London, England

[54] CODE TRANSLATION CIRCUITS
4 Claims, 7 Drawing Figs.

[52] U.S. Cl. .......... 340/347
[51] Int. Cl. .......... H03k 13/17
[50] Field of Search .......... 340/347; 330/25 (T), 34, 100, 104, 106, 110, 112

[56] References Cited
UNITED STATES PATENTS

| | | | |
|---|---|---|---|
| 3,161,868 | 12/1964 | Waldhauer | 340/347 |
| 3,187,325 | 6/1965 | Waldhauer | 340/347 |
| 3,259,896 | 7/1966 | Pan | 340/347 |
| 3,271,759 | 9/1966 | Hopper | 340/347 |
| 3,419,819 | 12/1968 | Murakami | 340/347 |
| 3,484,779 | 12/1969 | Kiyasu | 340/347 |

*Primary Examiner*—Maynard R. Wilbur
*Assistant Examiner*—Jeremiah Glassman
*Attorney*—Kirschstein, Kirschstein and Ottinger

ABSTRACT: A P.C.M. coder using the Waldhauer principle (see U.S. Pat. No. 3,187,325), of incorporating a current-switching decision-device in an amplifier feedback loop, in which each coding stage has only a single high-gain amplifier. In each such stage, the input analogue signal to the stage and a reference voltage are supplied to the amplifier and four diode rectifiers are connected in a bridge circuit in a feedback path across the amplifier. The amplifier of each stage supplies a digital signal representing the coding effected by that stage and the analogue output signal for passing onto the next stage is developed across a resistor which is connected across one diagonal of the bridge circuit.

Patented May 18, 1971 3,579,231

2 Sheets-Sheet 1

INVENTOR
PIOTR BYLANSKI

BY Kirschstein, Kirschstein, Ottinger & Frank

INVENTOR
PIOTR BYLANSKI
BY Kirchstein, Kirchstein Ottinger & Frank

CODE TRANSLATION CIRCUITS

This invention relates to binary coding circuits for translating a signal amplitude into a group of binary digits (i.e. a word), representing the signal amplitude.

The present invention is concerned with coding circuits known as stage-by-stage encoders which are employed, for example, in pulse-code-modulation (P.C.M.) systems. In one known form of stage-by-stage encoder an analog signal is encoded by applying it to an analog input of a first stage of such an encoder. The analog signal level is compared with a reference signal level and a first binary digit is obtained indicating the result. The analog 'residue,' as it is called, is passed on to the next stage where a finer comparison is made with a reference signal level. A second binary digit is obtained and the 'residue' is passed on to the next stage. This process may be continued for a number of stages according to the accuracy of coding required. The group of digits so obtained, one from each stage, forms the coded representation of the original analog signal level.

Coding circuits of this kind will be referred to as being of the kind specified.

It has been proposed that for an encoder of the kind specified each stage should comprise a feedback amplifier 'unit' circuit having two separate unidirectional feedback paths which conduct, respectively, one for one range of input levels and the other for an adjoining range (with no bias this would be one polarity and the other). Outputs of opposite polarity are obtained from the two feedback paths which outputs, on addition, that is, as obtained at the common point of the feedback paths, provide the digital output. On subtraction the two outputs provide the analog output.

Using such a circuit it has been proposed to construct an analog-to(reflected) binary encoder in which a number of pairs of these circuits are connected in tandem each pair providing one digit of the binary representation. The two circuits constituting each pair were provided to avoid difficulties arising in subtraction of the two outputs obtained from any one such unit circuit. By feeding the two series of tandem circuits in phase opposition two outputs of opposite polarity will be obtained from one circuit of a pair which are mirrored by the two outputs obtained from the other circuit of the pair. Thus by cross connecting the outputs a wholly positive characteristic of the required form can be obtained and, separately, a wholly negative characteristic of the required form can be obtained. No subtraction is necessary, as it would be, using only one series of the unit circuits, the required characteristic being obtained by mere addition of selected outputs.

An object of the present invention is to provide a stage-by-stage encoding circuit which necessitates only a single series of 'unit' circuits.

According to the present invention, in a binary coding circuit of the kind specified at least one stage comprises an amplifier to the input of which is applied in operation an analog input signal for comparison with a reference signal, and a feedback circuit comprising a bridge network having a nonlinear device in each arm, an impedance connected across one diagonal and the amplifier input and output terminals connected across the other, the digital output signal being provided by the amplifier output and the analog output signal being developed across said impedance.

The bridge network preferably comprises a rectifier diode in each arm, the diodes being directed as for a fullwave bridge rectifier and said impedance being a resistor connected between the unidirectional current terminals of the bridge. The impedance may be connected to the two inputs of a differential amplifier from the output of which said analog output signal is obtained.

Alternatively, the first mentioned amplifier may be a differential amplifier having two inputs one of which and the output are connected across said other diagonal of the bridge network and said two inputs are connected across the said impedance of the preceding stage bridge network.

A binary coding circuit as exemplified by an analog-to-reflected binary encoder will now be described, by way of example, with reference to the accompanying drawings, of which:

Figure 1:
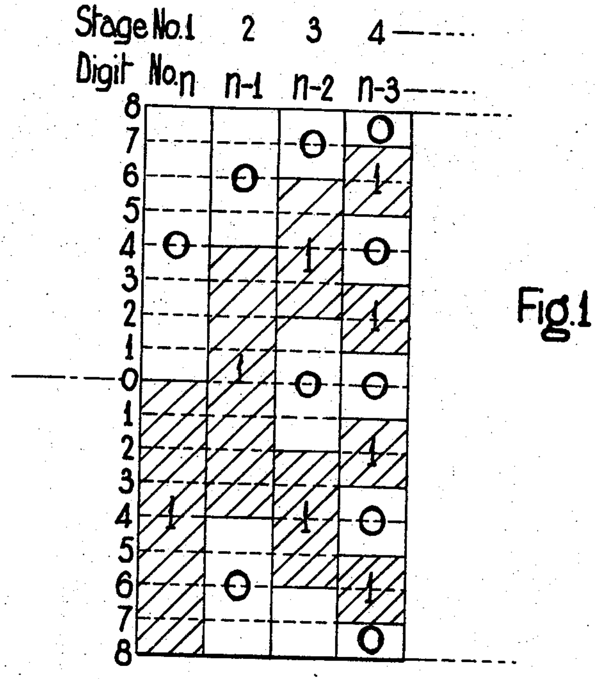
FIG. 1 is a code pattern for a four-digit reflected binary code.

A reflected binary code is essentially a symmetrical code as it is built up from an $n$ digit code to an $n+1$ digit code by reflection about a line following the last 'word' of $n$ digits and then distinguishing the words above and below the line by adding an $(n+1)$th digit, a 0 to all words above and a 1 to all below. These added digits are then of course the most significant. FIG. 1 shows such a reflected binary pattern of a four digit code giving a range of 16 levels.

Figure 2:
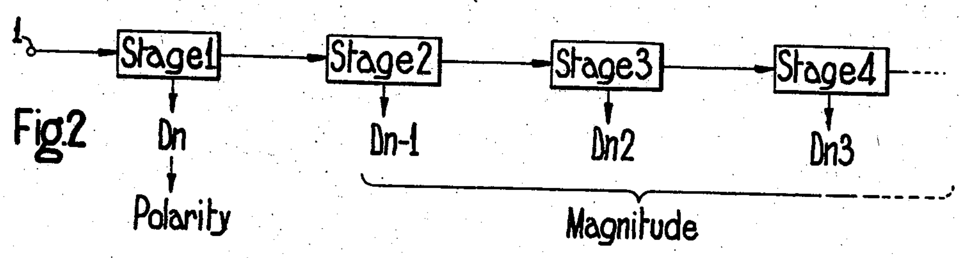
FIG. 2 is a schematic diagram of the overall coding circuit.

In the present stage-by-stage encoder, shown schematically in FIG. 2, the analog signal is applied to an input terminal 1 and the successive stages provide digital output signals of successively decreasing significance the digits being in accordance with the reflected binary code. This is achieved in the following way. Each stage produces a wholly positive analog output signal with a voltage magnitude gain of two. At each stage except the first, a constant reference voltage equal to half of the maximum analog input-signal is subtracted from the analog input signal. The resulting "residue" (which may be positive or negative) is amplified and its modulus applied to the next stage as the analog input signal for that stage. Because the same value of output is required whether the above residue is positive or negative each stage must have an analog characteristic symmetrical about the reference voltage level. The analog output/input relation is also required to be linear (2:1) so that each stage must have a V-characteristic.

The first stage has a characteristic centered on zero analog input volts in order to accommodate both polarities of input signal but is otherwise similar to the following stages which have characteristics centered on the reference voltage.

The digital signals of the encoder are provided by each stage in accordance with the polarity of the residue mentioned above, a positive residue producing a 0 and a negative residue producing a 1.

Figure 3:
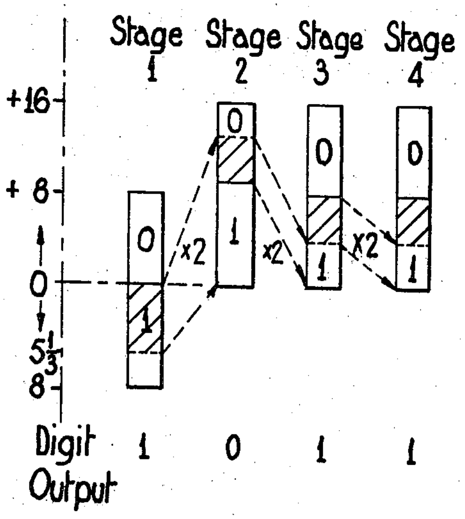
FIG. 3 is a diagram illustrating the process of coding in the reflected binary code.

The above broad picture of the stage-by-stage operation is illustrated in FIG. 3 where an initial range of analog input signal of −8 to +8 volts is assumed. The first stage is centered on zero analog input and the remaining stages on +8 volts. In each of the 'magnitude' stages (2, 3 & 4) the analog input level is compared against the reference level and a digital output of 0 is obtained if the reference is exceeded and 1 if not. The residue (the shaded portion) is, irrespective of sign then amplified and compared against the next reference level. An arbitrary initial analog level of −5.1/3 is chosen to illustrate the principle. The encoded version of this is 1011 which can be seen to accord with the value obtained from FIG. 1.

Figure 4:
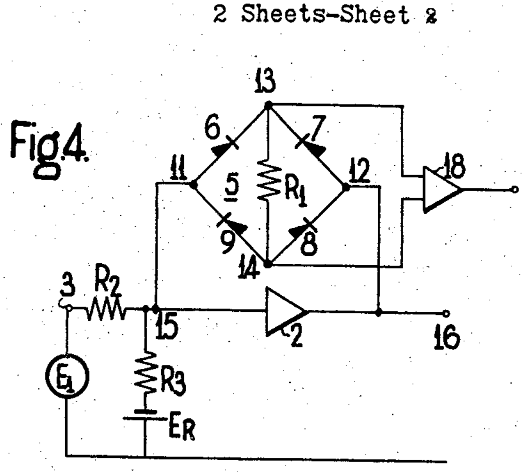
FIG. 4 is q circuit diagram of one stage of the coding circuit of FIG. 2.

The 'unit' circuit mentioned above, and having the required V-characteristic is shown in FIG. 4. An amplifier 2 giving a net phase-reversal has an analog input terminal 3 to which the analog signal $E_1$. The amplified residue of the previous stage is applied and has an output at terminal 16 constituting a digit output representative of the magnitude of the applied analog signal $E_1$. This digit output terminal 16 is connected to the analog input by means of a feedback circuit comprising a rectifier-diode bridge network 5. This bridge network has a diode (6, 7, 8 or 9) in each arm, the diodes being directed in the manner of a full-wave bridge rectifier, and the AC terminals 11, 12 of the bridge being connected to the amplifier input and output terminals 15 and 16 respectively. Across the DC terminals 13, 14, a resistor $R_1$ is connected. The DC terminals 13, 14 provide an analog output from the circuit by way of a differential amplifier 18.

In series with the analog input to the circuit, that is, between terminals 3 and 15, a resistor $R_2$ is connected which will in fact be the output resistor of the preceding stage. A reference voltage $E_R$ is applied to the analog input by way of a resistor $R_3$, the currents from these two sources being algebraically additive.

The amplifier has high voltage and high current gains and in view of the negative feedback provided, a finite output from the amplifier will suppress the input signal to substantially zero. The input to the amplifier, terminal 15, may therefore be considered as a virtual earth (i.e. at the zero potential of the system) and as passing zero current to the amplifier. Any input current to the circuit, from the analog or reference inputs must therefore bypass the amplifier and pass through the feedback circuit 5.

The circuit 5, being effectively a polarized rectifier, provides an analog output signal of fixed polarity (terminal 13 positive) irrespective of the polarity of the signal $E_1$ applied to terminal 3. As mentioned above all stages after the first are required to be insensitive to the polarity of the input signal. The analog input to the stage now being considered (FIG. 4) will therefore be unidirectional and will be assumed to be wholly positive and lying within the range 0 to plus 16 volts.

If the (positive) analog input level is $E_1$, the analog output voltage (across resistor $R_1$) is $E_2$ and the reference voltage is $E_R$, the modulus of the analog output voltage $E_2$ can be seen to be given by:

$$E_2=\left|\frac{E_1}{R_2}+\frac{E_R}{R_3}\right|R_1$$

If $R_1$ is made equal to $2R_2$ this becomes $$E_2=\left|2E_1+\frac{2E_RR_2}{R_3}\right|$$

and if $R_2$ is made equal to $R_3$ and $E_R$ equal to minus half the overall range of $E_2$ i.e. −8 volts, this becomes $E_2=|2E_1-16|$. This expresses only the magnitude of $E_2$ as its sign is determined solely by the direction of the rectifier diodes 6, which are, of course, fixed.

It can be seen from the expression $$E_2=|2E_1-16|$$

that for a range of analog input level $E_1$ from 0 to +16 volts the analog output voltage has a range of from +16 volts to 0 to +16 volts if the output is taken in that direction which makes $E_2$ always positive. The expression for $E_2$ involves the required magnification of twice $E_1$, the above change of $E_1$ from 0 to +8 volts giving an output change of from +16 volts to 0, for example.

Figures 5, 6:
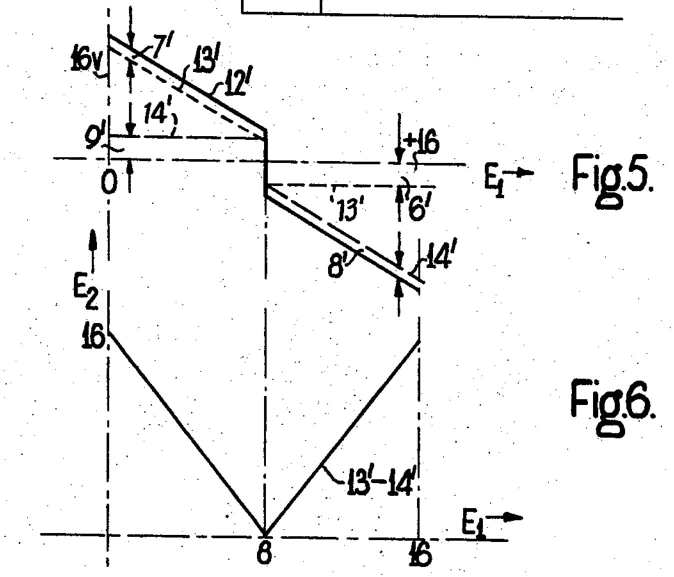
FIGS. 5 and 6 are voltage characteristics illustrating the operation of FIG. 4.

Referring now to FIGS. 4, 5 & 6, for values of $E_1$ between 0 and +8 volts diodes 7 and 9 are forward biased (by the reference voltage $E_R$ =−8 volts). The potential of terminal 14 is therefore positive with respect to the virtual earth terminal 15 by the forward voltage drop of the diode 9. This is shown in FIG. 5 by the horizontal part of the broken line referenced 9′. Within this same range of analog input, 0 to +8 volts, the current in resistor $R_1$ is decreasing linearly and the consequent potential of terminal 13 is given by the sum of the forward voltage drop of diode 9 and the voltage across resistor $R_1$ that is, by the left-hand portion of the broken line 13′ in FIG. 5. The potential of terminal 12 in this analog input range is thus displaced from the line 13′ by the forward voltage drop of diode 7 to give the broken line 12′ in FIG. 5.

When the analog input signal level passes through +8 volts, that is, the digital decision point, diodes 7 and 9 become reverse biased and diodes 6 and 8 become forward biased. Terminal 13 then maintains a constant potential negative to earth (the right-hand portion of the broken line 13′) while terminal 14 and terminal 12 adopt increasingly negative potentials as shown in FIG. 5.

At the actual transition through the decision point (+8 volts) it can be seen from FIG. 5 that the potential of terminal 12, and therefore of the digital output terminal, undergoes a sudden change of polarity with a level shift of approximately four times the forward voltage drop of one of the diodes 6, 7, 8 and 9. It is this polarity change which constitutes the digital output. The positive potential of terminal 12 on the left half of FIG. 5 represents a 1 and the negative potential on the right half represents a 0.

The analogue output of the stage is derived across resistor $R_1$ thus effectively differencing the potentials of the two terminals 13, 14. The effect of this is shown in FIG. 6, the result being a unidirectional output having the required V-characteristic.

Each stage can be said to determine in which of two sections of the overall range the analog level lies, giving a digital output indicating that section and expanding the relevant section for examination by the next stage.

The differential amplifier 18 supplying the analog input of the next stage may comprise a transistor connected as a constant current source and having two collector paths in parallel. Each of these collector paths then includes the emitter-collector path of a respective transistor, the collectors of these two transistors being connected to earth by way of respective resistors. The analog output is taken from across one of these collector resistors. The resistor $R_1$ connected across the bridge network of the 'unit' circuit has its ends connected to the base electrodes of the two collector path transistors, the more negative end of the resistor being connected to that transistor from which the output is taken.

The 'floating' output obtained across resistor $R_1$ is thus tied down to earth. The output from the differential amplifier is then applied to the analog input of the next stage.

In an alternative arrangement for interconnecting the stages the above differential amplifier is embodied in the amplifier of the 'unit' circuit. In this arrangement the two analog output leads from one stage are connected to the two inputs of a differential amplifier, which constitutes the unit amplifier of the next stage. One of these inputs is connected to earth by way of a resistor, while the bridge feedback circuit of this next stage is connected between the other input and the differential amplifier the output.

The bridge resistor provides the analog input to the following stage in similar manner.

An important advantage arising from the bridge circuit of the invention is that no accurate balancing of resistors is required, as in the previously proposed arrangement using separate feedback paths, in order to make the stage gain independent of the analog input polarity.

In applying the invention to a 'straight' binary encoder the reference voltage has to be subtracted only if this results in a positive residue, that is, if the analog input signal exceeds the reference level. In each stage therefore a reference level of half the maximum, or zero is subtracted from the analog input signal according to whether the preceding digit was 0 or 1. For this purpose the reference signal is supplied by way of a gate which is controlled by the digital output of the preceding stage.

Figure 7:
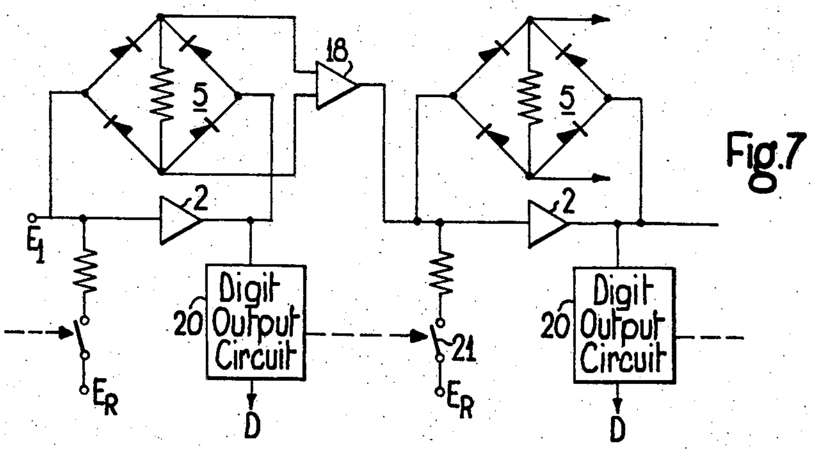
FIG. 7 is a circuit diagram corresponding to FIG. 4 but modified to provide a 'straight binary code.'

This arrangement is shown in FIG. 7, the controlling digit output circuit being referenced 20 and the controlled gate (shown simply as a switch) referenced 21.

The necessity for controlling the reference level in each stage does tend to reduce the speed of operation compared to that of the reflected binary encoder described above where the reference level is constant and independent of previous decisions.

I claim:

1. In a binary coding circuit of the kind comprising a plurality of stages connected in tandem, each stage having an analog input, a digital output and an analog output connected to the analog input of the next stage, an analog residue being passed on from each stage, after a digital decision has been made, at least one said stage comprises an amplifier, means for applying the analog residue and a reference signal to the input of said amplifier, and a feedback circuit comprising bridge network, one diagonal of which is connected between the amplifier output and the amplifier input, the bridge network having a nonlinear device in each arm and an impedance connected across the other diagonal, the digital output being provided by the amplifier output and the analog residue being developed across said impedance.

2. A binary coding circuit according to claim 1, wherein said bridge network comprises a rectifier diode in each arm, the diodes being directed as for a full-wave bridge rectifier and said impedance comprising a resistor connected between the unidirectional current terminals of the bridge network.

3. A coding circuit comprising, for each stage according to claim 1, a differential amplifier having two inputs, respectively connected to the termination of said impedance, the output of said differential amplifier being connected to the analog input of the following stage.

4. A straight binary coding circuit in accordance with claim 1, and comprising, in each stage after the first, means for controlling the application of said reference signal in dependence upon the digital output of the preceding stage.